United States Patent
Ding et al.

(10) Patent No.: US 12,467,128 B1
(45) Date of Patent: Nov. 11, 2025

(54) WAFER MANUFACTURING APPARATUS

(71) Applicant: Viavi Solutions Suzhou Co., Ltd., Suzhou (CN)

(72) Inventors: Ailing Ding, Shanghai (CN); Weibin Huang, Kunshan (CN); Yinxiang Xia, Suzhou (CN); Markus K. Tilsch, Santa Rosa, CA (US)

(73) Assignee: VIAVI SOLUTIONS SUZHOU CO., LTD., Suzhou (CN)

( * ) Notice: Subject to any disclaimer, the term of this patent is extended or adjusted under 35 U.S.C. 154(b) by 0 days.

(21) Appl. No.: 18/778,683

(22) Filed: Jul. 19, 2024

(51) Int. Cl.
    *C23C 14/50* (2006.01)
    *C23C 14/34* (2006.01)
    *H01J 37/32* (2006.01)
    *H01J 37/34* (2006.01)

(52) U.S. Cl.
    CPC ............ *C23C 14/50* (2013.01); *C23C 14/34* (2013.01); *H01J 37/32715* (2013.01); *H01J 37/3438* (2013.01)

(58) Field of Classification Search
    CPC .... C23C 14/50; C23C 14/34; H01J 37/32715; H01J 37/3438; H01J 37/3215; H01J 37/3478
    USPC .... 204/298.15, 192.1–192.38; 118/720, 721, 118/728
See application file for complete search history.

(56) References Cited

U.S. PATENT DOCUMENTS

| | | | | |
|---|---|---|---|---|
| 4,508,161 A | * | 4/1985 | Holden | ............ H01L 23/34 118/724 |
| 6,914,724 B2 | * | 7/2005 | Redmond | ............ G02B 3/00 359/619 |
| 2016/0268173 A1 | * | 9/2016 | Broadway | ............ G01B 11/255 |

* cited by examiner

*Primary Examiner* — Rodney G McDonald
(74) *Attorney, Agent, or Firm* — Harrity & Harrity, LLP

(57) ABSTRACT

In some implementations, a wafer holder apparatus includes a jig structure to receive a wafer, wherein the jig structure includes a first angled surface with respect to a nominal coating plane; and a spring structure to compress an end of the wafer against the first angled surface, wherein the spring structure includes: a spring; and a compression surface attached to the spring, wherein the compression surface includes a second angled surface matched to the first angled surface.

20 Claims, 6 Drawing Sheets

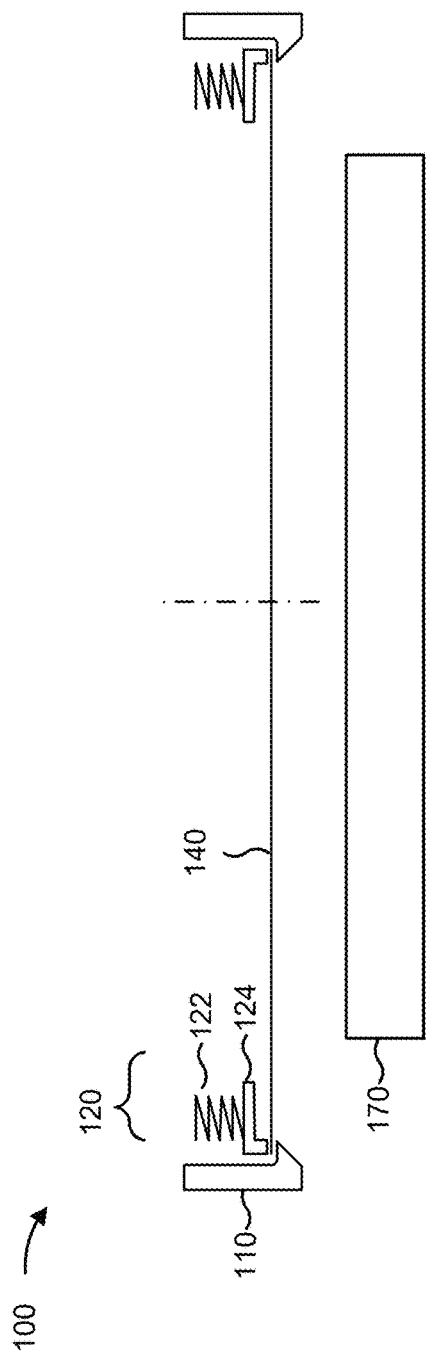
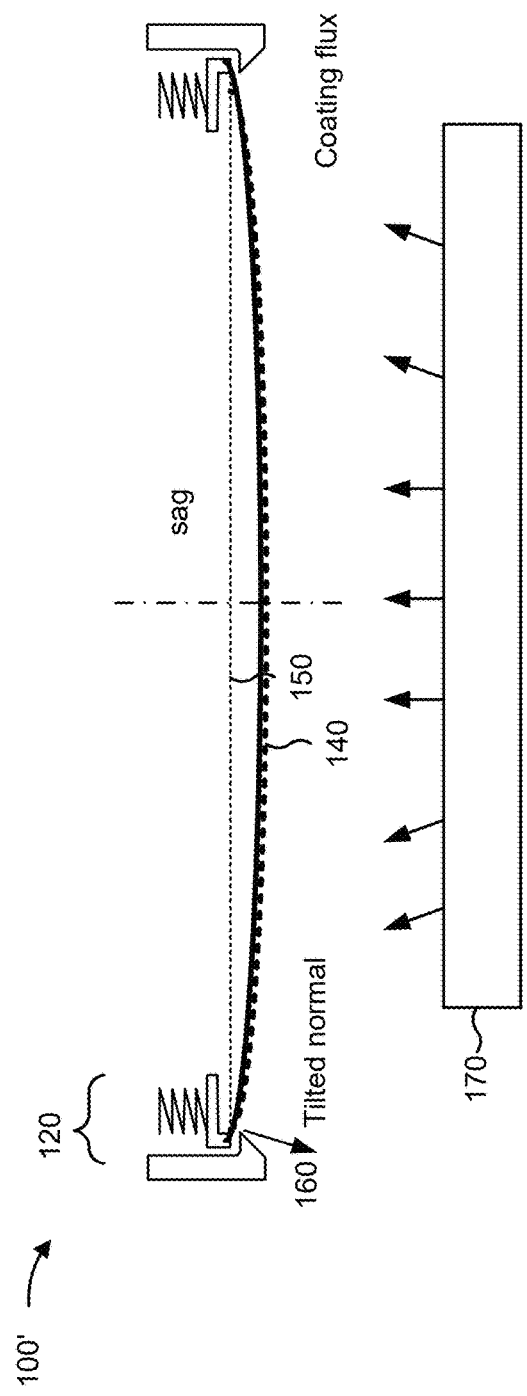

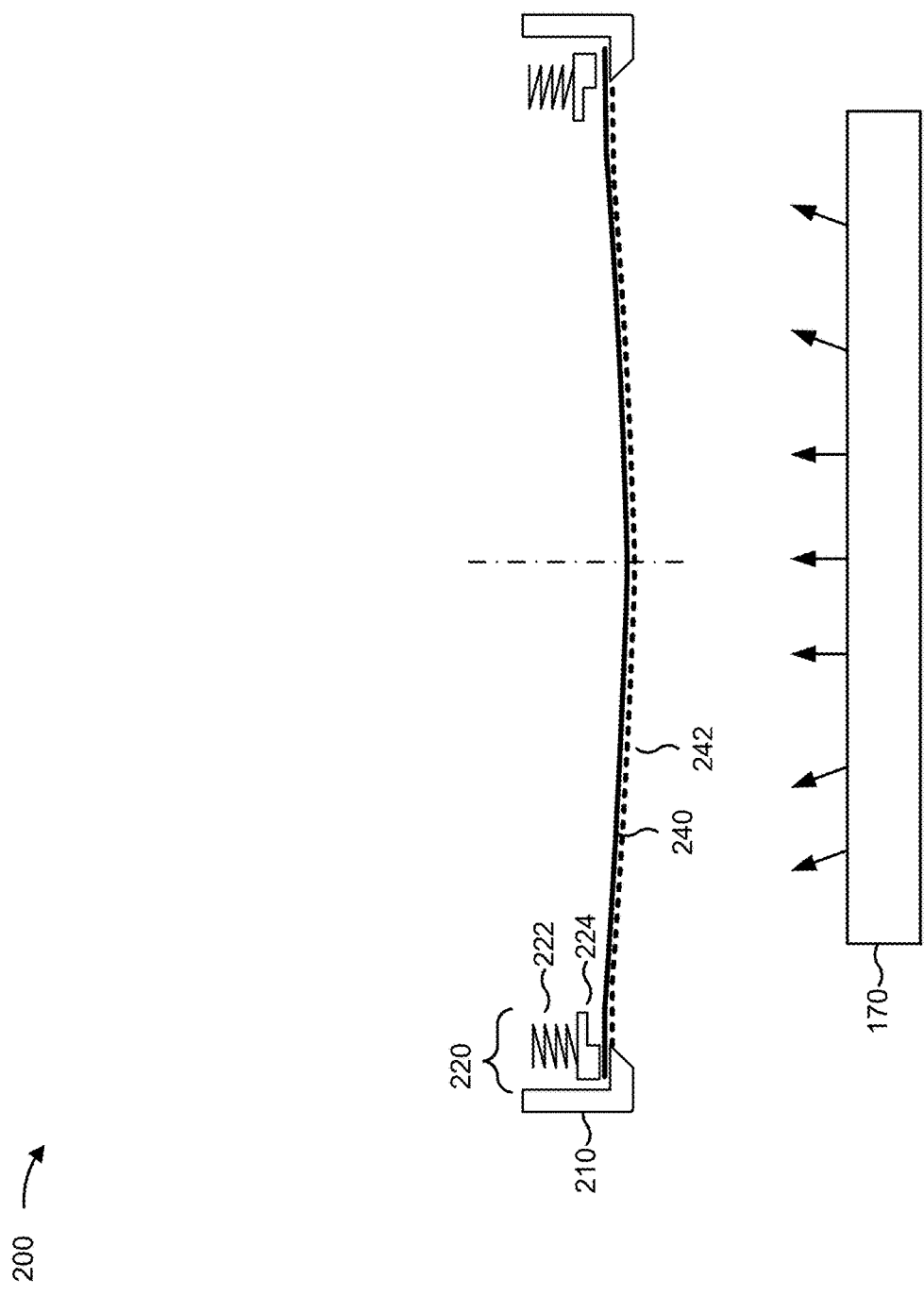

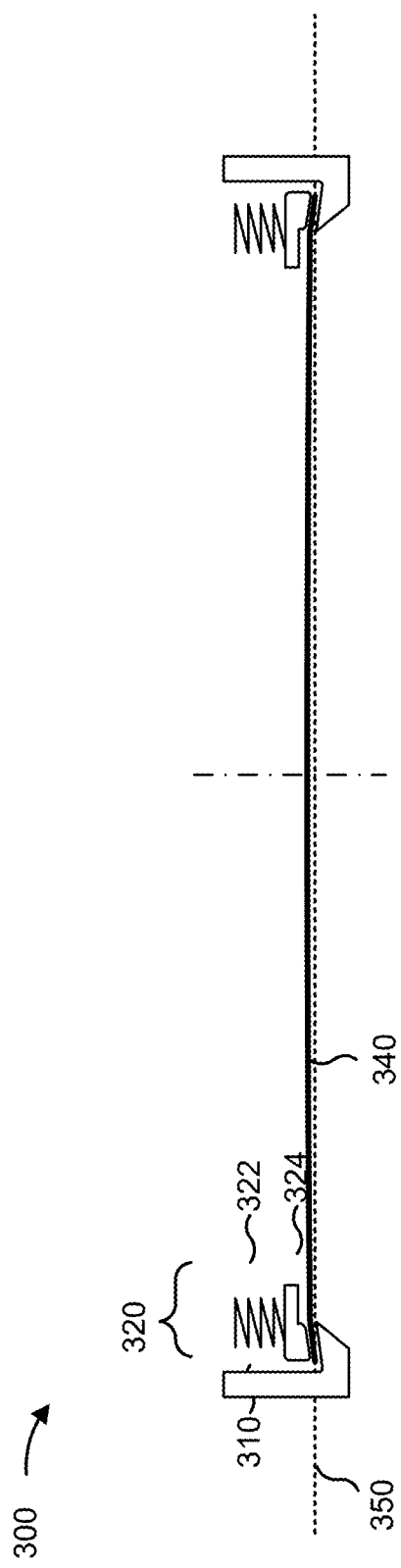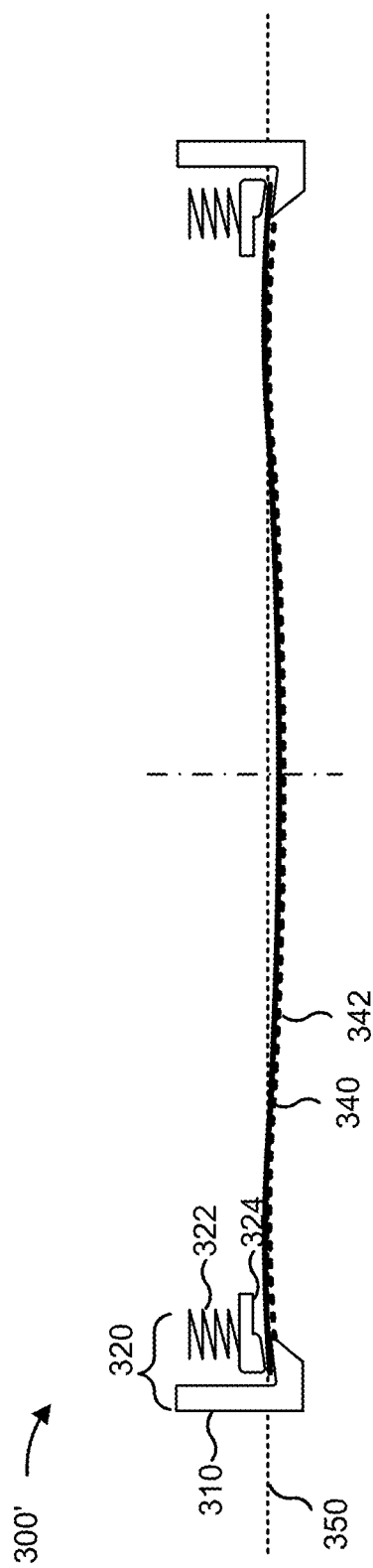

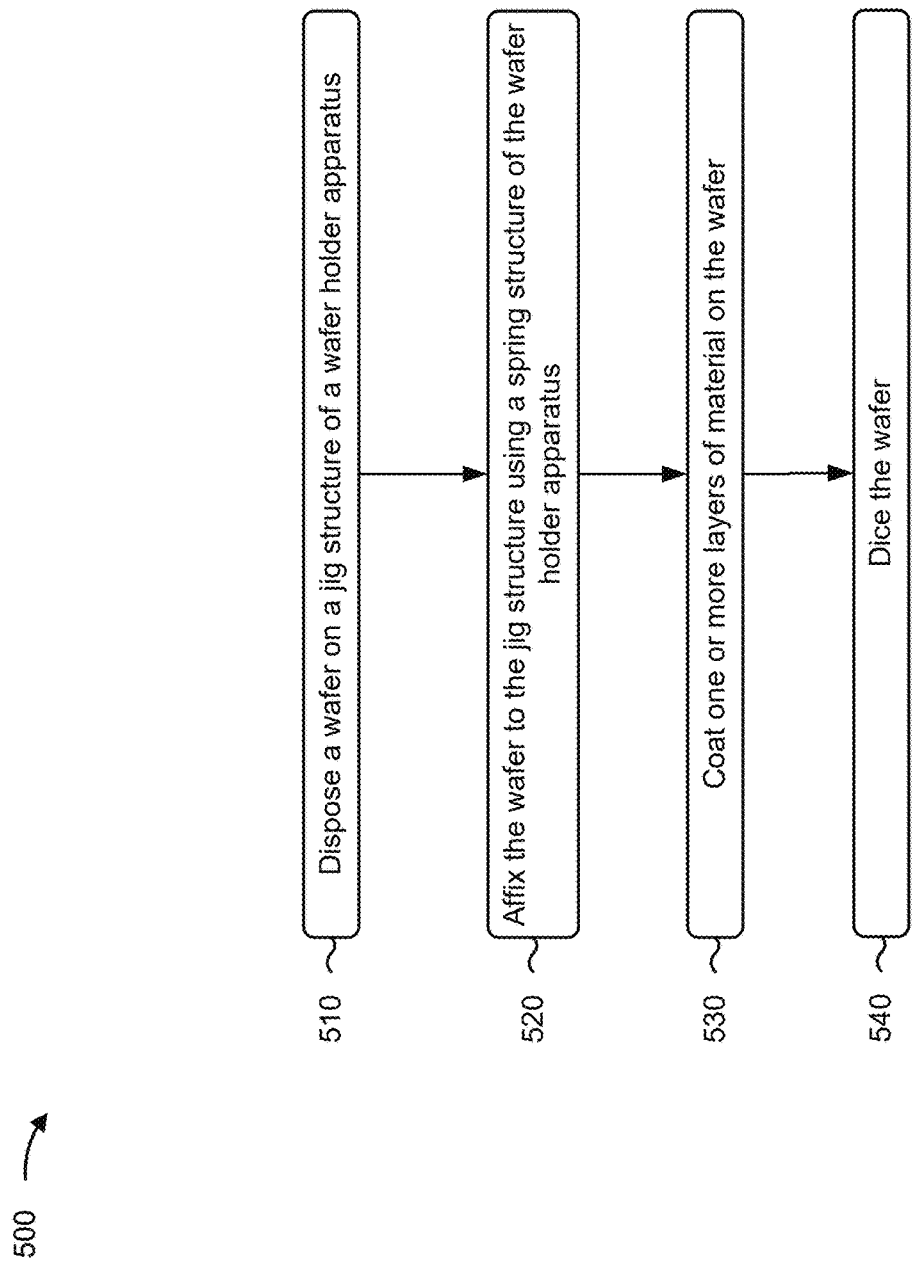

WAFER MANUFACTURING APPARATUS

BACKGROUND

Layered coatings may be used for fabrication of optical elements, semiconductor devices, sensors, display devices, micro-electromechanical system (MEMS) devices, or other types of components. For example, a manufacturing device may deposit a layered coating onto a wafer using a deposition process, such as a sputter deposition process. After one or more layers of material are deposited onto a surface of the wafer, the wafer may be diced into multiple discrete components, such as multiple semiconductor devices, multiple sensors, multiple optical elements, or another type of component.

SUMMARY

In some implementations, a wafer holder apparatus includes a jig structure to receive a wafer, wherein the jig structure includes a first angled surface with respect to a nominal coating plane; and a spring structure to compress an end of the wafer against the first angled surface, wherein the spring structure includes: a spring; and a compression surface attached to the spring, wherein the compression surface includes a second angled surface matched to the first angled surface.

In some implementations, a method includes disposing a wafer on a jig structure of a wafer holder apparatus; wherein the jig structure includes a press ring that is at least 3 millimeters (mm) in width; affixing the wafer to the jig structure using a spring structure of the wafer holder apparatus, wherein the spring structure is configured to compress an end of the wafer against the press ring such that at least 3 mm of width of the wafer is in contact with the press ring; and coating one or more layers of material on the wafer.

In some implementations, a wafer holder apparatus includes a jig structure to receive a wafer, wherein the jig structure includes a press ring to receive the wafer; and a spring structure to compress an end of the wafer against the press ring such that at least a threshold diameter of the wafer overlaps with the press ring, wherein the threshold diameter is based on an optimization of a coating surface of the wafer relative to a yield of the wafer, and wherein the spring structure includes: a spring; and a compression surface attached to the spring.

BRIEF DESCRIPTION OF THE DRAWINGS

FIGS. 1A-1B are diagrams of an example of a wafer manufacturing apparatus.

FIGS. 2A-2B are diagrams of an example implementation associated with wafer manufacturing apparatus.

FIGS. 3A-3B are diagrams of an example implementation associated with wafer manufacturing apparatus.

FIG. 5 is a flowchart of an example process associated with wafer manufacturing apparatus.

DETAILED DESCRIPTION

Figure 2B:
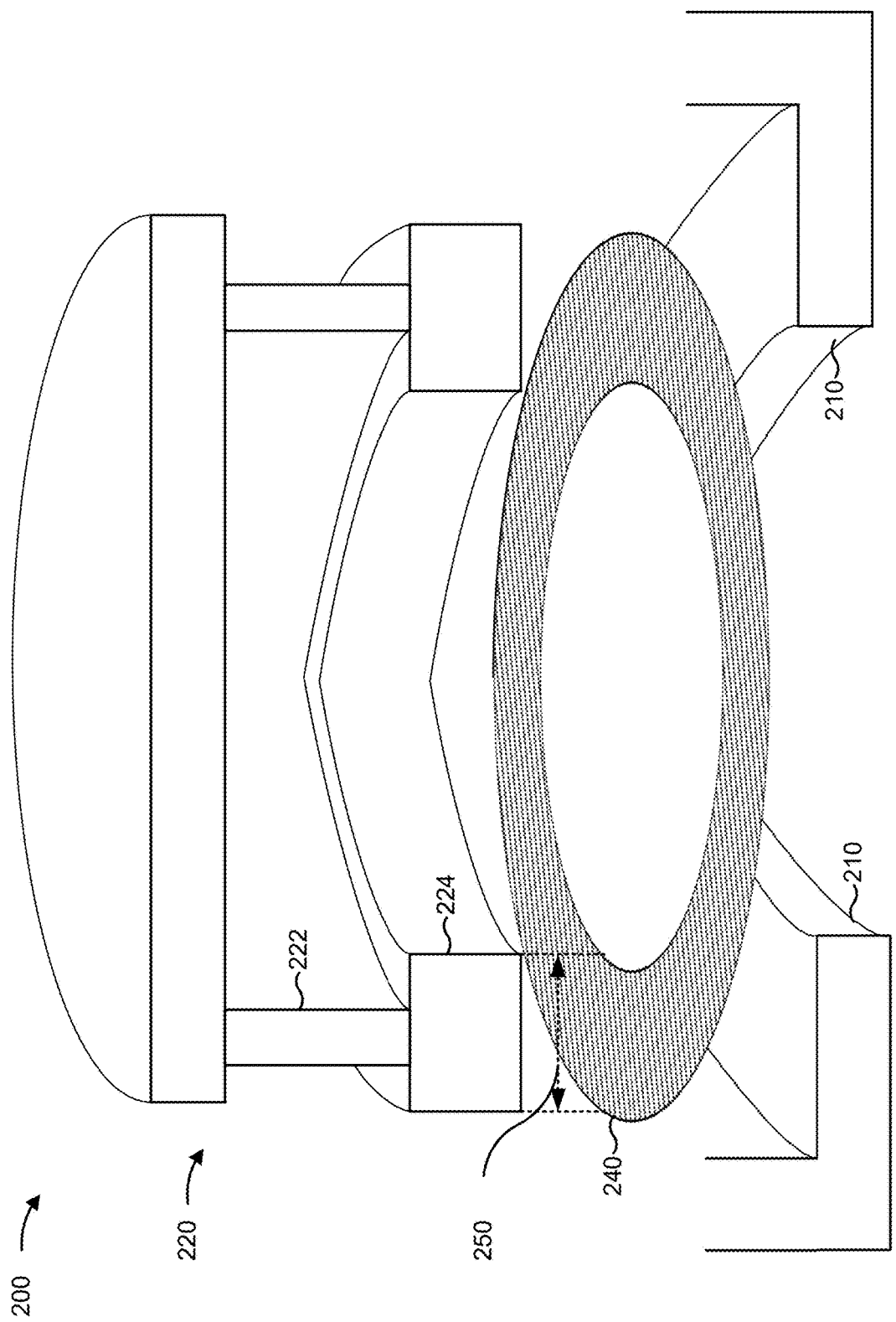

The following detailed description of example implementations refers to the accompanying drawings. The same reference numbers in different drawings may identify the same or similar elements.

Deposition processes may include a deposition device depositing a layer of material on a wafer, which may then be diced into many individual components. For example, in a sputtering procedure, molecules of one or more materials may be deposited, from a material source, on a wafer target. The wafer may be fixed in a wafer holder apparatus. The wafer holder apparatus may include a clamp that is attached to an outside edge of the wafer to maintain the wafer in a fixed position with respect to the material source. A portion of the wafer that is covered by the clamp may not receive any deposited material during deposition, and may be discarded after the deposition process is completed. Accordingly, the portion of the wafer that is covered by the clamp may be minimized in order to maximize an amount of surface area of the wafer that receives deposited material and does not need to be discarded.

In one example, material is sputtered from a coating source. The material traverses a vacuum and condenses when the material reaches a surface (e.g., of a wafer). On an exposed portion of a wafer surface area (e.g., that is not covered by a jig or clamp), a desired film is grown by deposition of the material. In this example, the coating firmly adheres to a substrate (e.g., the surface of the wafer). Depending on the coating material and process conditions, the growing coating may be formed in a compressive stress state. In a compressive stress state, the coating is stressed, such that the coating cannot expand in a plane of the substrate to an unstressed (larger) size because the coating is firmly adhered to the substrate. Based on a set of factors, such as a substrate thickness, a compressive stress state of the coating material, a thickness of the coating material, or a lateral dimension of the substrate, among other examples, the coating will mechanically deform the substrate as a result of the compressive stress state.

Accordingly, a wafer may have a flat surface before any coating is deposited, but may, as a film (e.g., the coating) grows, deform due to growing stress bending. Such deformation may be referred to as a "sag" or "sagging" of the wafer. In addition to the sag, individual surface elements of the wafer may tilt relative to a plane of the wafer before coating. Differences in sag and tilt may result in different growth rates of the coating across the wafer. As a consequence, the thicknesses of the coating across the wafer may vary. With varied coating thickness, an optical response of coated filters, formed from the wafer and the coating, may vary. As a result, some coated filters may not meet a desired optical specification. Such coated filters may be rejected, which may result in a yield of the wafer being reduced. Yield loss could be avoided if the substrate did not undergo the mechanical changes during coating. Accordingly, it may be desirable for a wafer holder apparatus to minimize mechanical changes during coating, such as by maintaining the wafer in a non-sagged position or compensating for a predicted amount of sag.

Although some aspects are described herein in terms of compressive stress in the coating, it is contemplated that aspects described herein may be used for other scenarios, such as tensile stress scenarios (e.g., when a coating is stressed toward shrinkage rather than expansion).

FIGS. 1A-1B are diagrams of an example 100 of a wafer manufacturing apparatus. As shown in FIGS. 1A-1B, the example 100 includes a jig structure 110 and a spring structure 120. The spring structure 120 includes a spring 122 and a compression surface 124.

As shown in FIG. 1A, a wafer 140 may be positioned in the wafer manufacturing apparatus, such that opposing surfaces of the jig structure 110 and the spring structure 120 clamp the wafer 140 in position. The compression surface 124 may have a minimal contact surface with the wafer 140 to minimize an amount of the wafer 140 that is to be discarded after completion of a deposition process. However, as wafer sizes have become increasingly thin, some coatings, when under a stress condition, such as a compressive stress condition, may deform a wafer during deposition (e.g., by causing sagging). For example, as shown in FIG. 1B, when coating hydrogenated silicon (Si:H) on a 0.2 millimeter (mm) thick, 200 mm diameter glass wafer 140, the deposition of the hydrogenated silicon may result in a sag of, for example, 10 mm with respect to a nominal coating plane 150 (e.g., an original plane of the wafer 140). As shown by reference number 160, based on the deposition-induced sag, some of the wafer 140 (e.g., close to an edge of the wafer 140) may be deformed relative to a normal direction of the nominal coating plane 150. Accordingly, during deposition, differences in positions of the wafer 140 relative to a coating source 170 (e.g., differences in a distance between the wafer 140 and the coating source 170 across the surface of the wafer 140 as a result of sag), may result in differences in coating thickness on the wafer 140. Further, during deposition, the sag may result in a portion of the wafer 140 being tilted relative to the coating source 170 (e.g., as shown by reference number 160), which may result in differences in coating thickness, among other effects. Accordingly, some portions of the wafer 140 may have different thickness coatings, which may result in differential performance across the wafer 140 (e.g., when the wafer 140 is a monolithic element or differences in different optical elements formed from dicing the wafer 140). For example, when the wafer 140 is being used to form an optical element, some components formed from the wafer 140 may have relatively high levels of center wavelength variation, bandwidth variation, or coating thickness variation and relatively low levels of spectral quality. Accordingly, as wafers 140 become increasingly thin and compressive stress results in increased sag, yields may decrease as a result of higher rates of performance criteria failure.

As indicated above, FIGS. 1A-1B are provided as an example. Other examples may differ from what is described with regard to FIGS. 1A-1B.

Some implementations described herein provide a wafer manufacturing apparatus. For example, some implementations described herein provide a wafer manufacturing apparatus with a widened compression surface. As a result, the wafer manufacturing apparatus may reduce an amount of deformation (e.g., sagging) of a wafer during a coating procedure (e.g., which results in differential coating thickness and differential performance across the wafer). In this way, the wafer manufacturing apparatus increases yield (e.g., a quantity of components that can be formed from a single wafer) despite increasing an amount of area of the wafer that is discarded for being covered by the compression surface and lacking a deposited coating. Additionally, or alternatively, some implementations described herein provide a wafer manufacturing apparatus with an angled compression surface. In this example, when the angled compression surface is clamped to a wafer, the wafer may be biased (e.g., pre-deformed) in a direction opposite a coating-induced deformation direction. In other words, the angled compression surface may cause the wafer to be deformed upward (against a coating-induced sagging downward). In this case, when the coating stresses the wafer and causes the wafer to deform downward, the wafer is deformed toward the nominal coating plane rather than away from the nominal coating plane. In this way, the wafer manufacturing apparatus increases yield by reducing an amount of area of the wafer that fails to meet performance criteria as a result of coating-induced deformation.

FIGS. 2A-2B are diagrams of an example implementation associated with wafer manufacturing apparatus. As shown in FIGS. 2A-2B, in a cross-sectional view and a projected view, a wafer holder apparatus 200 may include a jig structure 210 and a spring structure 220. The spring structure 220 may include a spring 222 and a compression surface 224. The wafer holder apparatus 200 may be configured to receive a wafer 240, onto which is coated a coating layer 242. In some implementations, the jig structure 210 and the spring structure 220 may form a clamp ring. For example, as shown in FIG. 2B, the wafer holder apparatus 200 may form a cylindrical structure that clamps an outer edge of a wafer 240 (e.g., a flat, cylindrical wafer). Although some implementations are described herein in terms of a cylindrical wafer 240 and a cylindrical wafer holder apparatus, it is contemplated that other shapes may be possible, such as rectangular shapes, octagonal shapes, irregular shapes, or other types of shapes.

As shown in FIG. 2B, and by reference number 250, the compression surface 224 may be associated with at least a threshold width. For example, the compression surface 224 may have a width (and associated contact area) that is selected to optimize a yield of the wafer 240. In some implementations, the compression surface 224 may be associated with a width of 3.5 millimeters (mm) for a wafer 240 with a thickness of less than 0.4 mm (e.g., a 0.2 mm thick wafer or a 0.3 mm thick wafer). In this case, relative to the compression surface 124, shown in FIG. 1A, which may have a width of 1.5 mm, the compression surface 224 may increase a yield of the wafer 240 (relative to the wafer 140). In other words, rather than minimizing a width of the compression surface 224, to maximize an exposed surface area of the wafer 240 that can be coated with the coating layer 242, the width of the compression surface 224 may be extended to avoid (excess) deformation of the wafer 240 during coating with the coating layer 242.

In this way, by avoiding deformation of the wafer 240, a yield of the wafer 240 may be increased despite a greater amount of the wafer 240 being covered by the compression surface 224 (or an opposite surface of the jig structure 210). Further, by increasing a width of the compression surface 224 (and an associated contact area), the wafer holder apparatus 200 may achieve a lower level of crack loss than occurs in the example 100 shown in FIGS. 1A and 1B. Crack loss may occur when an amount of pressure on an area of a wafer exceeds a threshold pressure. In this case, by using an increased width (and associated contact area), an amount of pressure on the wafer 240 per unit of contact area is reduced, thereby reducing a likelihood of cracking and associated crack loss to the yield of the wafer 240 (relative to the wafer 140). For example, by increasing a width of the compression surface 224 from 1.5 mm to 3.4 mm for a wafer less than 0.4 mm in thickness, the wafer holder apparatus 200 may achieve a 5% yield increase relative to the example 100. Additionally, by reducing deformation of the wafer 240, the wafer holder apparatus 200 may increase flatness of the wafer 240 during coating, which may improve performance of optical elements formed from the wafer 240, such as by reducing center wavelength variation, reducing bandwidth variation, and/or reducing coating thickness variation. Further, as some components may be rejected if they fail to satisfy a threshold level relating to the center wavelength variation, bandwidth variation, or coating thickness variation, by reducing the center wavelength variation, bandwidth variation, or coating thickness variation, the wafer holder apparatus 200 may increase a yield (e.g., by reducing a rejection rate of components formed from the wafer 240).

As indicated above, FIGS. 2A-2B are provided as an example. Other examples may differ from what is described with regard to FIGS. 2A-2B.

FIGS. 3A-3B are diagrams of an example implementation associated with wafer manufacturing apparatus. As shown in FIGS. 3A-3B, in a cross-sectional view, a wafer holder apparatus 300 may include a jig structure 310 and a spring structure 320. The spring structure 320 may include a spring 322 and a compression surface 324. The wafer holder apparatus 300 may be configured to receive a wafer 340, onto which is coated a coating layer 342.

In some implementations, the compression surface 324 and/or the jig structure 310 may have an angled surface. For example, the jig structure 310 may have a first angled surface and the compression surface 324 may have a second angled surface. In this case, the first angled surface and the second angled surface are angled with respect to a nominal coating plane 350 of the wafer 340. The nominal coating plane 350 may refer to a plane of the wafer 340. In this case, based on angling one or more surfaces that are compressed against the wafer 340 (e.g., the first angled surface and/or the second angled surface), the wafer 340 may be imparted with a pre-coating bias. In other words, when the compression surface 324 clamps the wafer 340 to the jig structure 310, the angled surfaces of the compression surface 324 and the jig structure 310 may cause the wafer 340 to be deformed. In this case, the deformation of the wafer 340 may be configured to be an inverse of a post-coating bias of the wafer 340. In other words, as shown in FIG. 3A, the wafer 340 may be deformed upward with a convex bias. Although some implementations are described in terms of a pre-coating concave bias and post-coating convex bias, it is contemplated that some implementations may include deformation with a pre-coating convex bias and a post-coating concave bias, or another type of deformation. For example, when a first side of the wafer 340 already has a coating on a first side, and is to be coated on a second side, the compression surface 324 may be configured to apply a pre-second-coating convex bias, which may be an inverse of a second-coating-induced concave bias.

Accordingly, when the wafer 340 is coated with the coating layer 342, which causes the wafer 340 to be deformed downward with a concave bias, the wafer 340 is deformed, by the coating layer 342, toward the nominal coating plane 350 (e.g., rather than away from the nominal coating plane 350, as was illustrated in FIG. 1B). Accordingly, by causing a pre-coating bias in the wafer 340, the wafer holder apparatus 300 reduces a total deformation away from the nominal coating plane 350 associated with coating. In this way, by reducing deformation of the wafer 340, the wafer holder apparatus 300 may increase flatness of the wafer 340 during coating, which may increase yield and which may improve performance of optical elements formed from the wafer 340, such as by reducing center wavelength variation, reducing bandwidth variation, and/or reducing coating thickness variation.

In some implementations, one or more parameters of the wafer holder apparatus 300 may be associated with optimizing a post-coating shape of the wafer 340. For example, an amount of deformation of the wafer 340, in connection with clamping by the jig structure 310 and the spring structure 320, may be associated with an angle of the angled surfaces, a size of the angled surfaces (e.g., a width of the compression surface 324), or a spring force applied by the spring 322 (e.g., which may be related to a spring thickness or a spring bend angle, as described in more detail herein).

As indicated above, FIGS. 3A-3B are provided as an example. Other examples may differ from what is described with regard to FIGS. 3A-3B.

Figure 4:
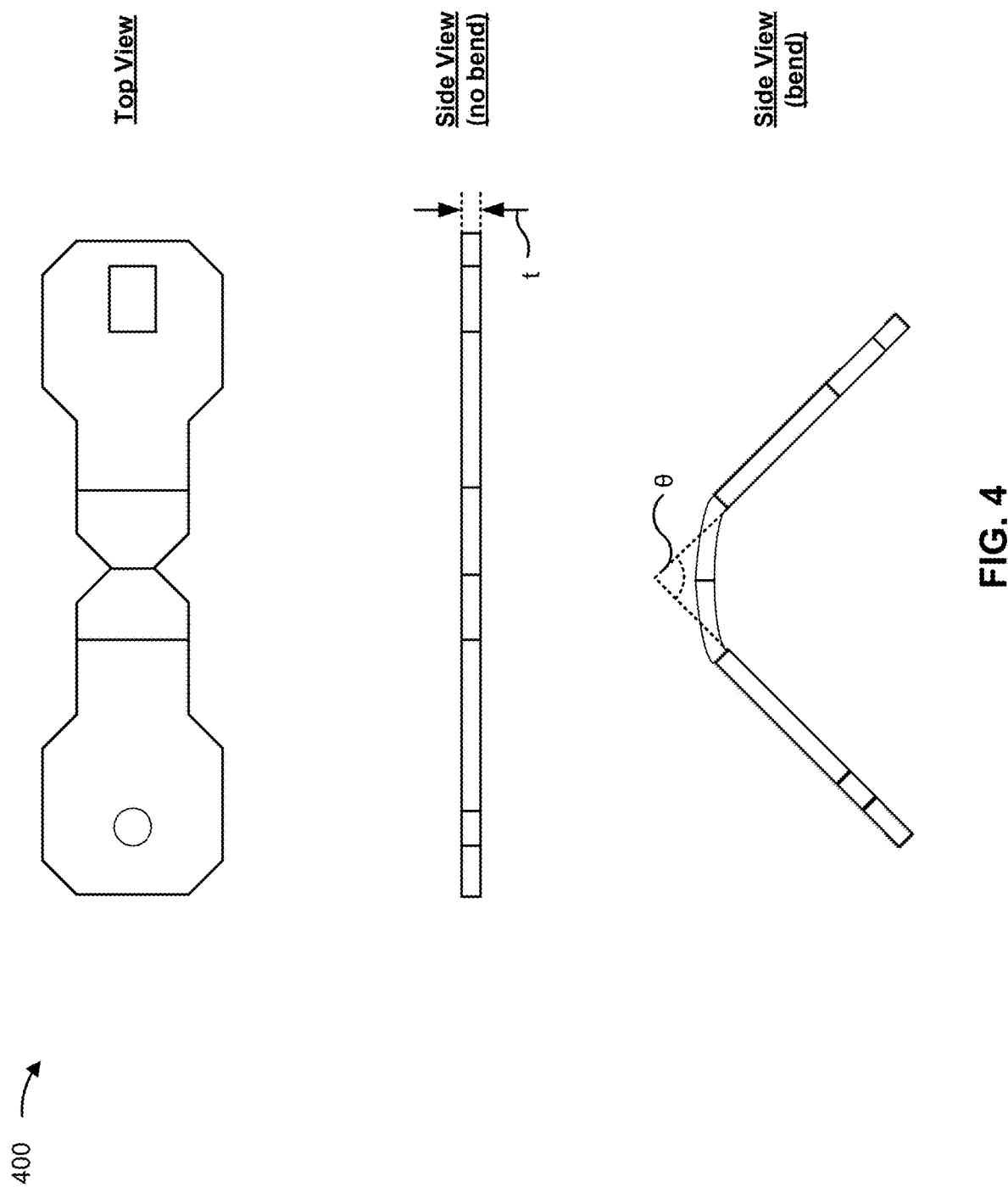
FIG. 4 is a diagram of an example implementation of a spring, which may correspond to the spring structure, the spring, the spring structure, or the spring, among other examples.

FIG. 4 is a diagram of an example implementation 400 of a spring, which may correspond to the spring structure 220, the spring 222, the spring structure 320, or the spring 322, among other examples. As shown in FIG. 4, a flat spring may be bent with a particular bend angle, $\theta$, to achieve a particular amount of spring force. The bend angle, $\theta$, may be selected based on a force associated with optimizing a shape of a wafer (e.g., the wafer 340) in connection with a coating procedure. For example, increasing a bend angle (e.g., to, in one example, a configured angle of 30 degrees), can increase an amount of force that is applied to a wafer. In this case, the bend angle, $\theta$, may be selected based on a thickness of the wafer, a diameter of the wafer, a material of the wafer, a characteristic of a coating layer (e.g., an amount of stress the coating layer induces in the wafer), or another factor. For example, the bend angle may, $\theta$, be selected to deform the wafer, such that during a coating procedure the wafer is optimized toward maximizing flatness of the wafer. Additionally, or alternatively, the flat spring may be manufactured with a particular thickness, t, to achieve a particular amount of spring force. The thickness, t, may be selected based on a force associated with optimizing a shape of a wafer (e.g., the wafer 340) in connection with a coating procedure. For example, increasing a thickness (e.g., to, in one example, 0.7 millimeters (mm)), can increase an amount of force that is applied to a wafer.

As indicated above, FIG. 4 is provided as an example. Other examples may differ from what is described with regard to FIG. 4.

FIG. 5 is a flowchart of an example process 500 associated with wafer manufacturing apparatus. In some implementations, one or more process blocks of FIG. 5 are performed by a wafer manufacturing apparatus (e.g., a pick-and-place device, a computer-controlled wafer manufacturing device, a magnetic sputtering device, or another type device). In some implementations, one or more process blocks of FIG. 5 are performed by another device or a group of devices separate from or including the wafer manufacturing apparatus, such as a wafer holder apparatus (e.g., the wafer holder apparatus 200 or the wafer holder apparatus 300).

As shown in FIG. 5, process 500 may include disposing a wafer on a jig structure of a wafer holder apparatus (block 510). For example, the wafer manufacturing apparatus may dispose a wafer on a jig structure of a wafer holder apparatus, as described above. In some implementations, the jig structure includes a press ring that is at least 3 mm in width. For example, the jig structure and a spring structure may have matching compression surfaces that are at least 3 mm in width (e.g., 3.4 mm in width).

As further shown in FIG. 5, process 500 may include affixing the wafer to the jig structure using a spring structure of the wafer holder apparatus (block 520). For example, the wafer manufacturing apparatus may affix the wafer to the jig structure using a spring structure of the wafer holder apparatus, as described above. In some implementations, the spring structure is configured to compress an end of the wafer against the press ring such that at least 3 mm of width of the wafer is in contact with the press ring. For example, the spring structure may result in a 3 mm ring around the edge of the wafer being covered by the press ring (e.g., opposing compression surfaces of the spring structure and the jig structure).

As further shown in FIG. 5, process 500 may include coating one or more layers of material on the wafer (block 530). For example, the wafer manufacturing apparatus may coat one or more layers of material on the wafer, as described above.

As further shown in FIG. 5, process 500 may include dicing the wafer (block 540). For example, the wafer manufacturing apparatus may dice the wafer to produce a set of components from the wafer, such as a set of optical elements, as described above.

Process 500 may include additional implementations, such as any single implementation or any combination of implementations described below and/or in connection with one or more other processes described elsewhere herein.

In a first implementation, the press ring includes an angled surface, and wherein affixing the wafer to the jig structure using the spring structure comprises pre-stressing the wafer with a first bias in a first direction.

In a second implementation, alone or in combination with the first implementation, depositing the one or more layers of material on the wafer comprises coating the one or more layers of material such that the wafer is stressed with a second bias in a second direction.

In a third implementation, alone or in combination with one or more of the first and second implementations, a parameter of the wafer holder apparatus is selected such that the first bias is matched to the second bias, and wherein the parameter includes at least one of the width of the wafer that is in contact with the press ring, an angle of the angled surface, or a compressive force of the spring structure on the wafer.

In a fourth implementation, alone or in combination with one or more of the first through third implementations, the wafer is associated with a thickness of less than 0.4 mm.

In a fifth implementation, alone or in combination with one or more of the first through fourth implementations, coating the one or more layers on the wafer comprises depositing the one or more layers on the wafer using a sputter deposition process.

In a sixth implementation, alone or in combination with one or more of the first through fifth implementations, the one or more layers includes a first layer of a first material and a second layer of a second material, such that the second layer, when deposited on the first layer, biases a shape of the wafer with respect to a nominal coating plane.

In a seventh implementation, alone or in combination with one or more of the first through sixth implementations, a deformation of the wafer, in connection with the coating of the one or more layers, is less than a threshold deformation with respect to a nominal coating plane.

In an eighth implementation, alone or in combination with one or more of the first through seventh implementations, process 500 includes dicing the wafer into a plurality of optical elements.

Although FIG. 5 shows example blocks of process 500, in some implementations, process 500 includes additional blocks, fewer blocks, different blocks, or differently arranged blocks than those depicted in FIG. 5. Additionally, or alternatively, two or more of the blocks of process 500 may be performed in parallel.

The foregoing disclosure provides illustration and description, but is not intended to be exhaustive or to limit the implementations to the precise forms disclosed. Modifications and variations may be made in light of the above disclosure or may be acquired from practice of the implementations.

As used herein, the term "component" is intended to be broadly construed as hardware, firmware, or a combination of hardware and software. It will be apparent that systems and/or methods described herein may be implemented in different forms of hardware, firmware, and/or a combination of hardware and software. The actual specialized control hardware or software code used to implement these systems and/or methods is not limiting of the implementations. Thus, the operation and behavior of the systems and/or methods are described herein without reference to specific software code—it being understood that software and hardware can be used to implement the systems and/or methods based on the description herein.

As used herein, satisfying a threshold may, depending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

What is claimed is:

1. A wafer holder apparatus, comprising:
   a jig structure to receive a wafer,
      wherein the jig structure includes a first angled surface with respect to a nominal coating plane; and
   a spring structure to compress an end of the wafer against the first angled surface,
      wherein the spring structure includes:
         a spring; and
         a compression surface attached to the spring, wherein the compression surface includes a second angled surface matched to the first angled surface, and wherein the wafer holder apparatus is configured to hold the wafer, such that the wafer is imparted with a pre-coating bias that is an inverse of a post-coating bias.

2. The wafer holder apparatus of claim 1, wherein the pre-coating bias is a concave bias and the post-coating bias is a convex bias.

3. The wafer holder apparatus of claim 1, wherein the pre-coating bias is a convex bias and the post-coating bias is a concave bias.

4. The wafer holder apparatus of claim 1, wherein an angle of at least one of the first angled surface or the second angled surface is associated with causing the pre-coating bias such that a post-coating shape of the wafer is optimized.

5. The wafer holder apparatus of claim 1, wherein a spring force of the spring is associated with causing the pre-coating bias such that a post-coating shape of the wafer is optimized.

6. The wafer holder apparatus of claim 1, wherein at least one of a spring thickness or a spring bend angle is selected based on a configured force that is to be applied to the wafer.

7. The wafer holder apparatus of claim 1, wherein a size of at least one of the first angled surface or the second angled surface is associated with an optimization of a yield of the wafer relative to an exposed surface area of the wafer.

8. A method, comprising:
disposing a wafer on a jig structure of a wafer holder apparatus,
wherein the jig structure includes a press ring that is at least 3 millimeters (mm) in width;
affixing the wafer to the jig structure using a spring structure of the wafer holder apparatus by compressing an end of the wafer against the press ring such that at least 3 mm of width of the wafer is in contact with the press ring; and
coating one or more layers of material on the wafer,
wherein, based on affixing the wafer to the jig structure and coating the one or more layers of material on the wafer, the wafer is imparted with a pre-coating bias that is an inverse of a post-coating bias.

9. The method of claim 8, wherein the press ring includes an angled surface; and
wherein affixing the wafer to the jig structure using the spring structure comprises:
pre-stressing the wafer with a first bias in a first direction.

10. The method of claim 9, wherein coating the one or more layers of material on the wafer comprises:
coating the one or more layers of material on the wafer such that the wafer is stressed with a second bias in a second direction.

11. The method of claim 10, wherein a parameter of the wafer holder apparatus is selected such that the first bias is matched to the second bias, and
wherein the parameter includes at least one of:
the width of the wafer that is in contact with the press ring,
an angle of the angled surface, or
a compressive force of the spring structure on the wafer.

12. The method of claim 8, wherein the wafer is associated with a thickness of less than 0.4 mm.

13. The method of claim 8, wherein coating the one or more layers on the wafer comprises:
depositing the one or more layers on the wafer using a sputter deposition process.

14. The method of claim 8, wherein the one or more layers includes a first layer of a first material and a second layer of a second material, such that the second layer, when deposited on the first layer, biases a shape of the wafer with respect to a nominal coating plane.

15. The method of claim 8, wherein a deformation of the wafer, in connection with the coating of the one or more layers of material, is less than a threshold deformation with respect to a nominal coating plane.

16. The method of claim 8, further comprising:
dicing the wafer into a plurality of optical elements.

17. A wafer holder apparatus, comprising:
a jig structure to receive a wafer,
wherein the jig structure includes a press ring to receive the wafer; and
a spring structure to compress an end of the wafer against the press ring such that at least a threshold diameter of the wafer overlaps with the press ring,
wherein the threshold diameter is based on an optimization of a coating surface of the wafer relative to a yield of the wafer,
wherein the spring structure includes:
a spring; and
a compression surface attached to the spring, and
wherein the wafer holder apparatus is configured to hold the wafer, such that the wafer is imparted with a pre-coating bias that is an inverse of a post-coating bias.

18. The wafer holder apparatus of claim 17, wherein the yield of the wafer is based on satisfaction of a threshold, wherein the threshold is related to:
a center wavelength variation,
a bandwidth variation, or
a coating thickness variation.

19. The wafer holder apparatus of claim 17, wherein the press ring includes an angled surface to receive the wafer, wherein the angled surface has a configured angle with respect to a nominal coating plane of the wafer.

20. The wafer holder apparatus of claim 17, wherein the pre-coating bias is a concave bias and the post-coating bias is a convex bias.

\* \* \* \* \*